United States Patent
Deng

(10) Patent No.: US 10,083,654 B2
(45) Date of Patent: *Sep. 25, 2018

(54) METHOD OF ELIMINATING OLED DISPLAY PANEL MURA

(71) Applicant: Shenzhen China Star Optoelectronics Technology Co., Ltd., Shenzhen (CN)

(72) Inventor: Yufan Deng, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 239 days.

This patent is subject to a terminal disclaimer.

(21) Appl. No.: 15/106,826

(22) PCT Filed: Apr. 27, 2016

(86) PCT No.: PCT/CN2016/080325
§ 371 (c)(1),
(2) Date: Jun. 20, 2016

(87) PCT Pub. No.: WO2017/166347
PCT Pub. Date: Oct. 5, 2017

(65) Prior Publication Data
US 2018/0102091 A1  Apr. 12, 2018

(30) Foreign Application Priority Data

Mar. 31, 2016 (CN) .......................... 2016 1 0206476

(51) Int. Cl.
*G09G 3/3233* (2016.01)
*G09G 3/00* (2006.01)
*H01L 27/32* (2006.01)

(52) U.S. Cl.
CPC .......... *G09G 3/3233* (2013.01); *G09G 3/006* (2013.01); *H01L 27/3241* (2013.01); *G09G 2310/027* (2013.01); *G09G 2320/0233* (2013.01); *G09G 2320/0285* (2013.01); *G09G 2320/0673* (2013.01); *G09G 2320/0693* (2013.01); *G09G 2360/147* (2013.01)

(58) Field of Classification Search
CPC .................................................. G09G 3/3208
See application file for complete search history.

(56) References Cited

FOREIGN PATENT DOCUMENTS

| CN | 102930850 A | 2/2013 |
|---|---|---|
| TW | 200847123 A | 12/2008 |

*Primary Examiner* — Robin Mishler
(74) *Attorney, Agent, or Firm* — Leong C. Lei

(57) ABSTRACT

Disclosed is a method of eliminating OLED display panel Mura. The compensation gray scale which should be utilized is calculated according to the target brightnesses, the actual brightnesses at the 255 gray scale of the respective sub pixels, and the local gamma value at the present display gray scale, and then the OLED display panel is made to show the present compensation gray scale captured at present to determine whether the preset condition of ending the calculation of the compensation gray scale is achieved, and if it is not achieved, the actual brightness of the sub pixel at the compensation gray scale is captured to calculate again for obtaining the local gamma value at the present display gray scale and the compensation gray scale which should be utilized next time, and the iterative computation does not stop until the aforesaid preset condition is achieved.

15 Claims, 3 Drawing Sheets

METHOD OF ELIMINATING OLED DISPLAY PANEL MURA

FIELD OF THE INVENTION

The present invention relates to a display technology field, and more particularly to a method of eliminating OLED display panel Mura.

BACKGROUND OF THE INVENTION

The flat panel display elements possess many merits of thin frame, power saving, no radiation, etc. and have been widely used. The present flat panel display elements at present mainly comprise the Liquid Crystal Display (LCD) and the Organic Light Emitting Display (OLED).

An OLED possesses many outstanding properties of self-illumination, no requirement of backlight, high contrast, ultra-thin, wide view angle, fast response, applicability of flexible panel, wide range of working temperature, simpler structure and process. The OLED is considered as next generation flat panel display technology.

An OLED display generally comprises a substrate, an anode located on the substrate, an organic emitting layer located on the anodes, an electron transport layer located on the organic emitting layer, and a cathode located on the electron transport layer. As working, the Hole and the Electron from the cathode are injected to the organic emitting layer, these electrons and the holes are combined to generate excited electron-hole pairs, and the excited electron-hole pairs are converted from the excited state to the ground state for achieving illumination.

In the present production procedure of the flat panel display, the Mura (uneven brightness) often happens due to the reasons, such as the production processes, and a bright spot or a dark spot appears to lead to the display quality descend of the panel. Demura is a technology of eliminating the display Mura and making the image brightness uniform. The basic principle of the Demura technology is: making the panel show the gray scale image, and using the Charge Coupled Device (CCD) to capture the screen to capture the brightnesses of the respective pixel dots in the panel, and then adjusting the gray scale values or voltages of the pixel dots of the Mura area to make the over dark area become bright and to make the over bright area become dark to achieve the uniform display result.

As applying Demura technology in the practical production, not only good display result is requested but also the time needs to be short. It requires great and practical Demura algorithm. The Demura algorithm used in prior art is to estimate the gray scale value after correction according to the Gamma value and the target brightness. As the method of eliminating Mura of liquid crystal display disclosed in the patent CN201310695713.X, which the specific steps are: first capturing the actual brightness values of the respective sub pixels, and correcting the actual brightness values of the respective sub pixels according to the brightness correction coefficients, and then, calculating and obtaining the gray scale values after correction corresponding to all the sub pixels of the inputted image according to the brightness values and gamma values of the respective sub pixels, and the specific calculation formulas is $$X1 = L1^{\frac{1}{Y}},$$

wherein L1 is the brightness value after correction, and X1 is the gray scale value after correction, and Y represents the Gamma index.

In the OLED display panel, the difference of the gamma curve of the respective pixel dots, and particularly in the Mura area is larger. The expected compensation result cannot be realized with single calculation according to the unified gamma value or gamma curve. Therefore, the present Demura algorithm is not suitable for the OLED display panel.

SUMMARY OF THE INVENTION

An objective of the present invention is to provide a method of eliminating OLED display panel Mura, which can rapidly and effectively eliminate the OLED display panel Mura to ensure the brightness uniformity of the OLED display panel and to raise the display quality of the OLED display panel.

For realizing the aforesaid objective, the present invention provides a method of eliminating OLED display panel Mura, comprising steps of:

step 1, providing an OLED display panel and a brightness capturing device, and the OLED display panel is made to show a 255 gray scale, and employing the brightness capturing device to capture actual brightnesses of respective sub pixels of the OLED display panel at the 255 gray scale;

step 2, making the OLED display panel show a gray scale to be compensated;

step 3, employing the brightness capturing device to capture actual brightnesses of respective sub pixels of the OLED display panel at a present display gray scale;

step 4, calculating a local gamma value at the present display gray scale, and a calculation formula is:

$$Gamma_i = \frac{\log\left(\frac{L_i}{L_{255}}\right)}{\log\left(\frac{Gray_i}{255}\right)}$$

wherein i is an integer larger than or equal to 0, and i+1 is a number of a present iterative computation, and $Gamma_i$ is the local gamma value at the present display gray scale, and $L_i$ is the actual brightness of the sub pixel at the present display gray scale, and $L_{255}$ is the actual brightness of the sub pixel at the 255 gray scale, and the $Gray_i$ is the present display gray scale;

step 5, capturing preset target brightnesses of the respective sub pixels, and obtaining a compensation gray scale which should be utilized for achieving the preset target brightnesses of the sub pixels with calculation of the following calculation formula:

$$Gray_{i+1} = \left(\frac{L_{goal}}{L_{255}}\right)^{\frac{1}{Gamma_i}} \times 255;$$

wherein $L_{goal}$ is a target brightness of the sub pixel, and $Gray_{i+1}$ is the compensation gray scale;

step 6, making OLED display panel to show a compensation gray scale obtained by a present calculation to determine whether a preset condition of ending the calculation of the compensation gray scale is achieved;

if the condition of ending the calculation of the compensation gray scale is not achieved, then returning back to the step 3;

if the condition of ending the calculation of the compensation gray scale is achieved, then ending the method.

The brightness capturing device is a brightness meter.

The brightness capturing device is a CCD.

In the step 3, a picture of a display image of the OLED display panel at the present display gray scale with the CCD to obtain actual brightnesses of the respective sub pixels of the OLED display panel at the present gray scale.

In the step 6, the condition of ending the calculation of the compensation gray scale is: a difference value of the actual brightness and the target brightness of the sub pixel is smaller than a preset allowable deviation brightness.

In the step 6, the condition of ending the calculation of the compensation gray scale is: the number of the present iterative computation reaches a preset number of a maximum iterative computation.

The preset number of the maximum iterative computation is three.

In the step 6, the condition of ending the calculation of the compensation gray scale is: a difference value of the actual brightness and the target brightness of the sub pixel is smaller than a preset error brightness or a number of the present iterative computation reaches a preset number of a maximum iterative computation.

In the step 5, the preset target brightnesses of the respective sub pixels are captured with a corresponding gamma curve of the gamma value of the OLED display panel.

The present invention further provides a method of eliminating OLED display panel Mura, comprising steps of:

step 1, providing an OLED display panel and a brightness capturing device, and the OLED display panel is made to show a 255 gray scale, and employing the brightness capturing device to capture actual brightnesses of respective sub pixels of the OLED display panel at the 255 gray scale;

step 2, making the OLED display panel show a gray scale to be compensated;

step 3, employing the brightness capturing device to capture actual brightnesses of respective sub pixels of the OLED display panel at a present display gray scale;

step 4, calculating a local gamma value at the present display gray scale, and a calculation formula is:

$$Gamma_i = \frac{\log\left(\frac{L_i}{L_{255}}\right)}{\log\left(\frac{Gray_i}{255}\right)}$$

wherein i is an integer larger than or equal to 0, and i+1 is a number of a present iterative computation, and $Gamma_i$ is the local gamma value at the present display gray scale, and $L_i$ is the actual brightness of the sub pixel at the present display gray scale, and $L_{255}$ is the actual brightness of the sub pixel at the 255 gray scale, and the $Gray_i$ is the present display gray scale;

step 5, capturing preset target brightnesses of the respective sub pixels, and obtaining a compensation gray scale which should be utilized for achieving the preset target brightnesses of the sub pixels with calculation of the following calculation formula:

$$Gray_{i+1} = \left(\frac{L_{goal}}{L_{255}}\right)^{\frac{1}{Gamma_i}} \times 255;$$

wherein $L_{goal}$ is a target brightness of the sub pixel, and $Gray_{i+1}$ is the compensation gray scale;

step 6, making OLED display panel to show a compensation gray scale obtained by a present calculation to determine whether a preset condition of ending the calculation of the compensation gray scale is achieved;

if the condition of ending the calculation of the compensation gray scale is not achieved, then returning back to the step 3;

if the condition of ending the calculation of the compensation gray scale is achieved, then ending the method;

wherein the brightness capturing device is a CCD.

wherein in the step 5, the preset target brightnesses of the respective sub pixels are captured with a corresponding gamma curve of the gamma value of the OLED display panel.

The benefits of the present invention are: the present invention provides a method of eliminating OLED display panel Mura. The compensation gray scale which should be utilized is calculated according to the target brightnesses, the actual brightnesses at the 255 gray scale of the respective sub pixels, and the local gamma value at the present display gray scale, and then the OLED display panel is made to show the present compensation gray scale to determine whether the preset condition of ending the calculation of the compensation gray scale is achieved, and if the preset condition of ending the calculation of the compensation gray scale is not achieved, the actual brightness of the sub pixel at the gray scale is captured to calculate again for obtaining the local gamma value at the present display gray scale and the compensation gray scale which should be utilized next time, and the iterative computation does not stop until the preset condition of ending the calculation of the compensation gray scale is achieved. In comparison with prior art, the present invention can make the brightness of the sub pixel closer to the target brightness with the compensation gray scale obtained by the multiple times of the iterative computation, which can rapidly and effectively eliminate the OLED display panel Mura to ensure the brightness uniformity of the OLED display panel and to raise the display quality of the OLED display panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
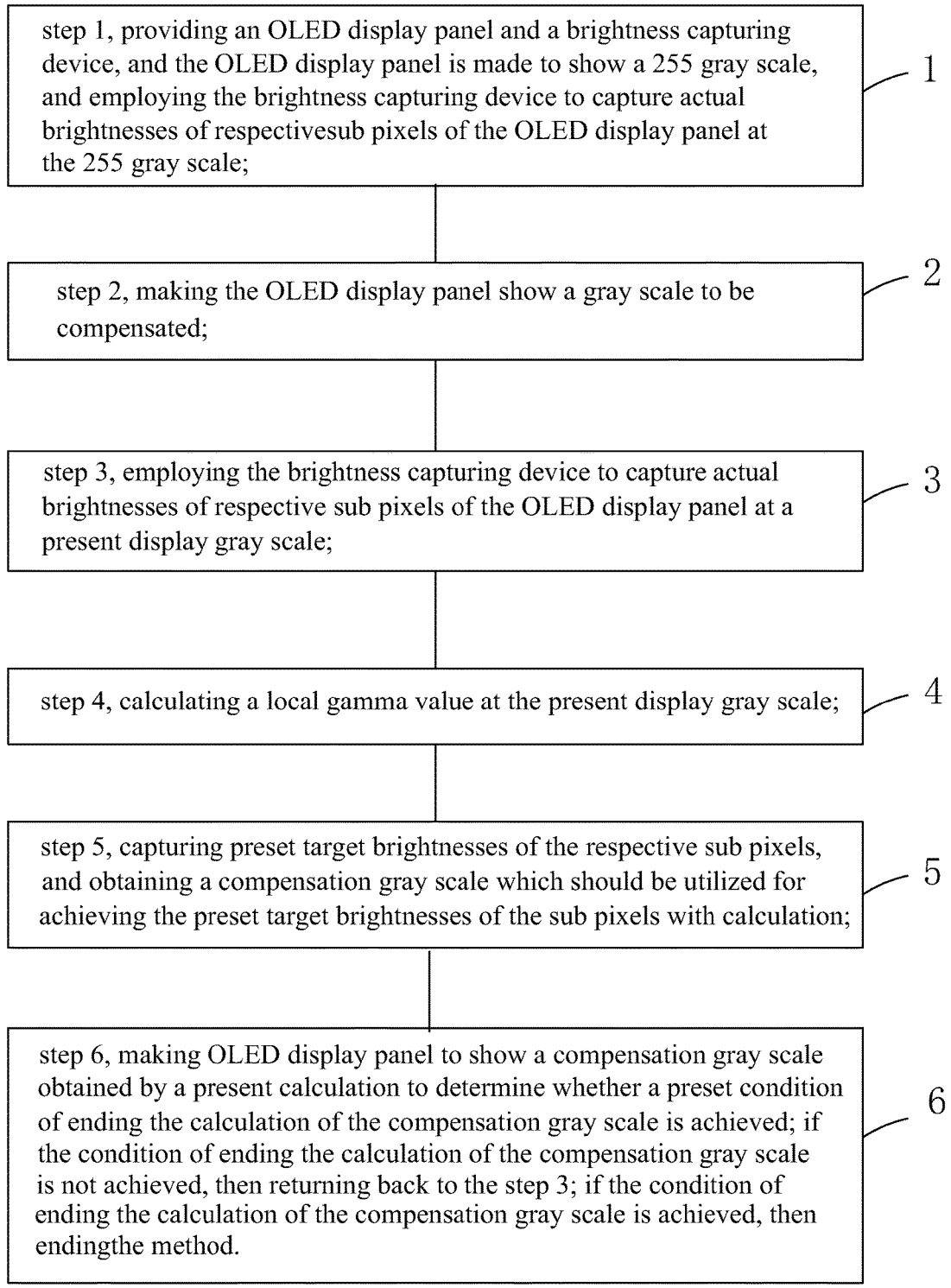
FIG. 1 is a flowchart of a method of eliminating OLED display panel Mura according to the present invention.
Figure 2:
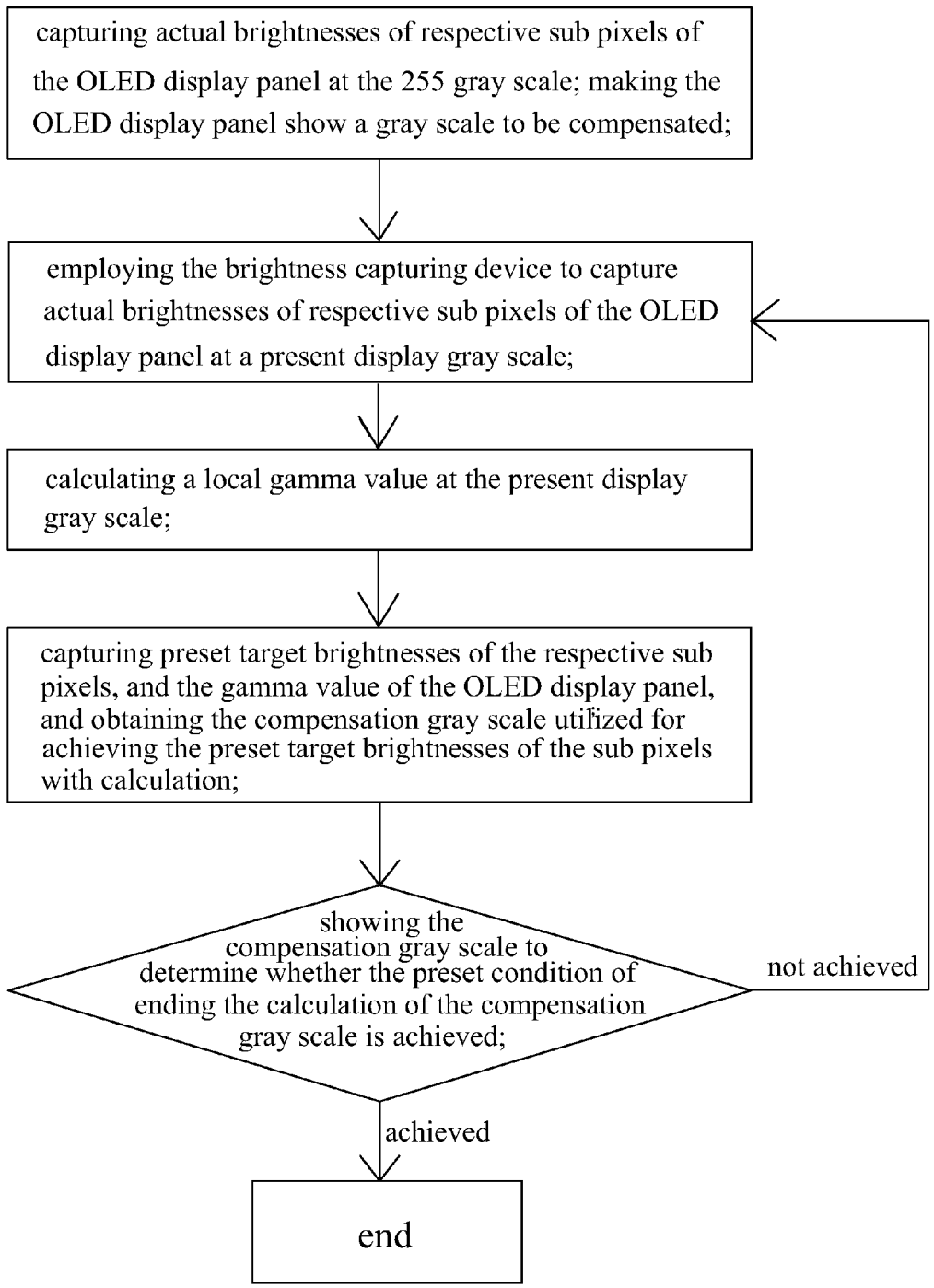
FIG. 2 is an operational logic diagram of a method of eliminating OLED display panel Mura according to the present invention.

Please refer to FIG. 1 in conjunction with FIG. 2. The present invention provides a method of eliminating OLED display panel Mura, comprising steps of:

step 1, providing an OLED display panel and a brightness capturing device, and the OLED display panel is made to show a 255 gray scale, and employing the brightness capturing device to capture actual brightnesses of respective sub pixels of the OLED display panel at the 255 gray scale;

Specifically, the brightness capturing device can be a brightness meter or a CCD.

step 2, making the OLED display panel show a gray scale to be compensated.

step 3, employing the brightness capturing device to capture actual brightnesses of respective sub pixels of the OLED display panel at a present display gray scale.

Specifically, the CCD is illustrated, in the step 3, a picture of a display image of the OLED display panel at the present gray scale with the CCD to obtain actual brightnesses of the respective sub pixels of the OLED display panel at the present gray scale, and only one captured picture is required for capturing the actual brightnesses of the respective sub pixels each time. The operation is easy and thus the operation rate of compensating gray scale can speed up.

step 4, calculating a local gamma value at the present display gray scale, and a calculation formula is:

$$Gamma_i = \frac{\log\left(\frac{L_i}{L_{255}}\right)}{\log\left(\frac{Gray_i}{255}\right)}$$

wherein i is an integer larger than or equal to 0, and i+1 is a number of a present iterative computation, and $Gamma_i$ is the local gamma value at the present display gray scale, and $L_i$ is the actual brightness of the sub pixel at the present display gray scale, and $L_{255}$ is the actual brightness of the sub pixel at the 255 gray scale, and the $Gray_i$ is the present display gray scale;

step 5, capturing preset target brightnesses of the respective sub pixels, and obtaining a compensation gray scale which should be utilized for achieving the preset target brightnesses of the sub pixels with calculation of the following calculation formula:

$$Gray_{i+1} = \left(\frac{L_{goal}}{L_{255}}\right)^{\frac{1}{Gamma_i}} \times 255;$$

wherein $L_{goal}$ is a target brightness of the sub pixel, and $Gray_{i+1}$ is the compensation gray scale.

Particularly, the local gamma value at the present display gray scale obtained with the calculation of the iterative computation in real time is utilized to calculate the compensation gray scale which should be utilized to effectively avoid that the difference of the local gamma value at the present display gray scale and the gamma value of the OLED display panel becomes too large (larger than twice of the gamma value of the OLED display panel) and results in the divergence of the actual brightness of the sub pixel in the iterative process and the situation of getting away from the target brightness farer and farer.

Specifically, in the first iterative computation, i=0, and the calculation formula corresponding to the local gamma value is:

$$Gamma_0 = \frac{\log\left(\frac{L_0}{L_{255}}\right)}{\log\left(\frac{Gray_0}{255}\right)},$$

and the calculation formula of compensating gray scale is:

$$Gray_1 = \left(\frac{L_{goal}}{L_{255}}\right)^{\frac{1}{Gamma_0}} \times 255,$$

wherein Gray0 is the gray scale to be compensated, and L0 is the actual brightness of the sub pixel at the gray scale to be compensated; in the second iterative computation, i=1, and the calculation formula corresponding to the local gamma value is:

$$Gamma_1 = \frac{\log\left(\frac{L_1}{L_{255}}\right)}{\log\left(\frac{Gray_1}{255}\right)},$$

and the calculation formula of compensating gray scale is:

$$Gray_2 = \left(\frac{L_{goal}}{L_{255}}\right)^{\frac{1}{Gamma_1}} \times 255;$$

in the third iterative computation, i=2, and the calculation formula corresponding to the local gamma value is:

$$Gamma_2 = \frac{\log\left(\frac{L_2}{L_{255}}\right)}{\log\left(\frac{Gray_2}{255}\right)},$$

and the calculation formula of compensating gray scale is:

$$Gray_3 = \left(\frac{L_{goal}}{L_{255}}\right)^{\frac{1}{Gamma_2}} \times 255,$$

and so on until the calculation of the compensation gray scale is ended, i.e. the result of the previous calculation is employed to be the parameter of the next calculation to be inputted into the next calculation to form the iterative computation.

step 6, making OLED display panel to show a compensation gray scale obtained by a present calculation to determine whether a preset condition of ending the calculation of the compensation gray scale is achieved;

if the condition of ending the calculation of the compensation gray scale is not achieved, then returning back to the step 3;

if the condition of ending the calculation of the compensation gray scale is achieved, then ending the method.

Specifically, in the step 6, the condition of ending the calculation of the compensation gray scale can be: a difference value of the actual brightness and the target brightness of the sub pixel is smaller than a preset allowable deviation brightness, i.e. the OLED display panel showing the present gray scale has already reached the expected display result;

In the step 6, the condition of ending the calculation of the compensation gray scale also can be: the number of the present iterative computation reaches a preset number of a maximum iterative computation;

In the step 6, the condition of ending the calculation of the compensation gray scale also can be: a difference value of the actual brightness and the target brightness of the sub pixel is smaller than a preset error brightness or a number of the present iterative computation reaches a preset number of a maximum iterative computation, and either one condition is reached, the calculation of the compensation gray scale can be ended.

Preferably, the preset number of the maximum iterative computation is three.

Figure 3:
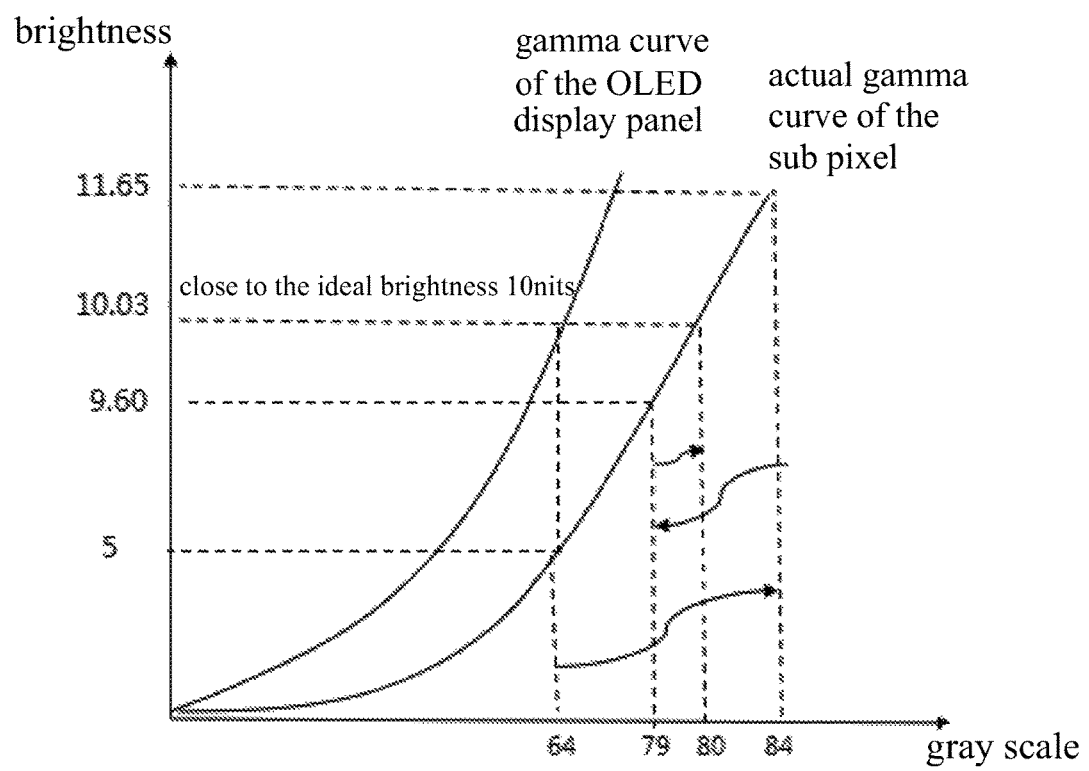
FIG. 3 is a diagram that the obtained compensation brightness gets close to the target brightness with the iterative computation according to the method of eliminating OLED display panel Mura according to the present invention.

Here, more detail description is conducted to the present invention with one specific iterative computation process. As shown in FIG. 3, supposing that the target brightness $L_{goal}$ of some sub pixel in the OLED display panel is 10 nits at 64 gray scale, and the actual brightness captured by the brightness capturing device is 5 nits, and the actual brightness of the 255 gray scale is 182 nits, and the gamma value of the OLED display panel is 2.2, wherein the target brightness is captured with a corresponding gamma curve of the gamma value 2.2 of the OLED display panel, and the actual gamma value of the sub pixel is different from the gamma value of the OLED display panel, and supposing that the actual gamma value at 32 gray scale is 2.8, and the actual gamma value at the 128 gray scale is 2.2, and the actual gamma value between the 32 gray scale and the 128 gray scale is similar with the linear change (the actual gamma value of the sub pixel is not required in the specific calculation, it is merely for the description of contrast), and then the corresponding gamma curves of the two do not coincide, either, and one compensation gray scale is obtained with the first iterative computation by utilizing the calculation formula of the present invention according to the aforesaid known conditions:

$$Gamma_0 = \frac{\log\left(\frac{L_0}{L_{255}}\right)}{\log\left(\frac{Gray_0}{255}\right)} = \frac{\log\left(\frac{5}{182}\right)}{\log\left(\frac{64}{255}\right)} = 2.60$$

$$Gray_1 = \left(\frac{L_{goal}}{L_{255}}\right)^{\frac{1}{Gamma_0}} \times 255 = \left(\frac{10}{182}\right)^{\frac{1}{2.6}} \times 255 \approx 84;$$

It can be obtained according to the actual gamma value of the sub pixel, the actual brightness of the sub pixel at 84 gray scale is 11.65 nits (the data is on the actual gamma curve of the sub pixel);

Specifically, the actual gamma value is used to obtain the actual brightness of the sub pixel for explaining the effect of the present invention here, but in practical operation, the OLED display panel is made to show the compensation gray scale 84 obtained by a present calculation because the actual gamma value of the sub pixel is unknown, and the actual brightness of the sub pixel at the 84 gray scale captured by the brightness capturing device, such as the CCD camera, is 11.68 nits.

Then, one more compensation gray scale is obtained with the second iterative computation:

$$Gamma_1 = \frac{\log\left(\frac{L_1}{L_{255}}\right)}{\log\left(\frac{Gray_1}{255}\right)} = \frac{\log\left(\frac{11.65}{182}\right)}{\log\left(\frac{84}{255}\right)} = 2.47$$

$$Gray_2 = \left(\frac{L_{goal}}{L_{255}}\right)^{\frac{1}{Gamma_1}} \times 255 = \left(\frac{10}{182}\right)^{\frac{1}{2.47}} \times 255 \approx 79$$

The OLED display panel is made to show the compensation gray scale 79 obtained by the present calculation, and the actual brightness of the sub pixel captured by the brightness capturing device at the gray scale is 9.60 nits, i.e. the actual brightness of the sub pixel at gray scale 79 on the actual gamma curve of the sub pixel is 9.60 nits; in contrast of the first iterative computation, the compensation gray scale obtained with the second iterative computation makes the actual brightness corresponded with the sub pixel gets closer to the target brightness.

Thereafter, another compensation gray scale is obtained with the third iterative computation:

$$Gamma_2 = \frac{\log\left(\frac{L_2}{L_{255}}\right)}{\log\left(\frac{Gray_2}{255}\right)} = \frac{\log\left(\frac{9.6}{182}\right)}{\log\left(\frac{79}{255}\right)} = 2.51$$

$$Gray_3 = \left(\frac{L_{goal}}{L_{255}}\right)^{\frac{1}{Gamma_2}} \times 255 = \left(\frac{10}{182}\right)^{\frac{1}{2.51}} \times 255 \approx 80$$

The OLED display panel is made to show the compensation gray scale 80 obtained by the present calculation, and the actual brightness of the sub pixel captured by the brightness capturing device at the gray scale is 10.03 nits, i.e. the actual brightness of the sub pixel at gray scale 80 on the actual gamma curve of the sub pixel is 10.03 nits; in contrast of the second iterative computation, the compensation gray scale obtained with the third iterative computation makes the actual brightness corresponded with the sub pixel gets closer to the target brightness.

As shown in FIG. 3, after each iterative computation, the brightness of the sub pixel will get closer to the target brightness and thus to achieve the uniform display result.

Accordingly, after the iterative computations of multiple times, the actual brightness of the sub pixel can get closer and closer to the target brightness to effectively overcome the issue of poor compensation result due to the actual gamma value abnormality in the Mura area in prior art, which can effectively eliminate the OLED display panel Mura to ensure the brightness uniformity of the OLED display panel and to raise the display quality of the OLED display panel.

In conclusion, the present invention provides a method of eliminating OLED display panel Mura. The compensation gray scale which should be utilized is calculated according to the target brightnesses, the actual brightnesses at the 255 gray scale of the respective sub pixels, and the local gamma value at the present display gray scale, and then the OLED display panel is made to show the present compensation gray scale captured at present to determine whether the preset condition of ending the calculation of the compensation gray scale is achieved, and if the preset condition of ending the calculation of the compensation gray scale is not achieved, the actual brightness of the sub pixel at the compensation gray scale is captured to calculate again for obtaining the local gamma value at the present display gray scale and the compensation gray scale which should be utilized next time, and the iterative computation does not stop until the preset condition of ending the calculation of the compensation gray scale is achieved. In comparison with prior art, the present invention can make the brightness of the sub pixel closer to the target brightness of the sub pixel with the compensation gray scale obtained by the multiple times of the iterative computation, which can rapidly and effectively eliminate the OLED display panel Mura to ensure the brightness uniformity of the OLED display panel and to raise the display quality of the OLED display panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A method of eliminating OLED display panel Mura, comprising steps of:
    step 1, providing an OLED display panel and a brightness capturing device, and the OLED display panel is made to show a 255 gray scale, and employing the brightness capturing device to capture actual brightnesses of respective sub pixels of the OLED display panel at the 255 gray scale;
    step 2, making the OLED display panel show a gray scale to be compensated;
    step 3, employing the brightness capturing device to capture actual brightnesses of respective sub pixels of the OLED display panel at a present display gray scale;
    step 4, calculating a local gamma value at the present display gray scale, and a calculation formula is:

$$Gamma_i = \frac{\log\left(\frac{L_i}{L_{255}}\right)}{\log\left(\frac{Gray_i}{255}\right)}$$

wherein i is an integer larger than or equal to 0, and i+1 is a number of a present iterative computation, and $Gamma_i$ is the local gamma value at the present display gray scale, and $L_i$ is the actual brightness of the sub pixel at the present display gray scale, and $L_{255}$ is the actual brightness of the sub pixel at the 255 gray scale, and the $Gray_i$ is the present display gray scale;
    step 5, capturing preset target brightnesses of the respective sub pixels, and obtaining a compensation gray scale which should be utilized for achieving the preset target brightnesses of the sub pixels with calculation of the following calculation formula:

$$Gray_{i+1} = \left(\frac{L_{goal}}{L_{255}}\right)^{\frac{1}{Gamma_i}} \times 255;$$

wherein $L_{goal}$ is a target brightness of the sub pixel, and $Gray_{i+1}$ is the compensation gray scale;
    step 6, making OLED display panel to show a compensation gray scale obtained by a present calculation to determine whether a preset condition of ending the calculation of the compensation gray scale is achieved;
    if the condition of ending the calculation of the compensation gray scale is not achieved, then returning back to the step 3;
    if the condition of ending the calculation of the compensation gray scale is achieved, then ending the method.

2. The method of eliminating OLED display panel Mura according to claim 1, wherein the brightness capturing device is a brightness meter.

3. The method of eliminating OLED display panel Mura according to claim 1, wherein the brightness capturing device is a CCD.

4. The method of eliminating OLED display panel Mura according to claim 3, wherein in the step 3, a picture of a display image of the OLED display panel at the present display gray scale with the CCD to obtain actual brightnesses of the respective sub pixels of the OLED display panel at the present gray scale.

5. The method of eliminating OLED display panel Mura according to claim 1, wherein in the step 6, the condition of ending the calculation of the compensation gray scale is: a difference value of the actual brightness and the target brightness of the sub pixel is smaller than a preset allowable deviation brightness.

6. The method of eliminating OLED display panel Mura according to claim 1, wherein in the step 6, the condition of ending the calculation of the compensation gray scale is: the number of the present iterative computation reaches a preset number of a maximum iterative computation.

7. The method of eliminating OLED display panel Mura according to claim 6, wherein the preset number of the maximum iterative computation is three.

8. The method of eliminating OLED display panel Mura according to claim 1, wherein in the step 6, the condition of ending the calculation of the compensation gray scale is: a difference value of the actual brightness and the target brightness of the sub pixel is smaller than a preset error brightness or a number of the present iterative computation reaches a preset number of a maximum iterative computation.

9. The method of eliminating OLED display panel Mura according to claim 1, wherein in the step 5, the preset target brightnesses of the respective sub pixels are captured with a corresponding gamma curve of the gamma value of the OLED display panel.

10. A method of eliminating OLED display panel Mura, comprising steps of:
    step 1, providing an OLED display panel and a brightness capturing device, and the OLED display panel is made to show a 255 gray scale, and employing the brightness capturing device to capture actual brightnesses of respective sub pixels of the OLED display panel at the 255 gray scale;
    step 2, making the OLED display panel show a gray scale to be compensated;
    step 3, employing the brightness capturing device to capture actual brightnesses of respective sub pixels of the OLED display panel at a present display gray scale;
    step 4, calculating a local gamma value at the present display gray scale, and a calculation formula is:

$$Gamma_i = \frac{\log\left(\frac{L_i}{L_{255}}\right)}{\log\left(\frac{Gray_i}{255}\right)}$$

wherein i is an integer larger than or equal to 0, and i+1 is a number of a present iterative computation, and $Gamma_i$ is the local gamma value at the present display gray scale, and $L_i$ is the actual brightness of the sub pixel at the present display gray scale, and $L_{255}$ is the actual brightness of the sub pixel at the 255 gray scale, and the $Gray_i$ is the present display gray scale;

step 5, capturing preset target brightnesses of the respective sub pixels, and obtaining a compensation gray scale which should be utilized for achieving the preset target brightnesses of the sub pixels with calculation of the following calculation formula:

$$Gray_{i+1} = \left(\frac{L_{goal}}{L_{255}}\right)^{\frac{1}{Gamma_i}} \times 255;$$

wherein $L_{goal}$ is a target brightness of the sub pixel, and $Gray_{i+1}$ is the compensation gray scale;

step 6, making OLED display panel to show a compensation gray scale obtained by a present calculation to determine whether a preset condition of ending the calculation of the compensation gray scale is achieved;

if the condition of ending the calculation of the compensation gray scale is not achieved, then returning back to the step 3;

if the condition of ending the calculation of the compensation gray scale is achieved, then ending the method;

wherein the brightness capturing device is a CCD;

wherein in the step 5, the preset target brightnesses of the respective sub pixels are captured with a corresponding gamma curve of the gamma value of the OLED display panel.

11. The method of eliminating OLED display panel Mura according to claim 10, wherein in the step 3, a picture of a display image of the OLED display panel at the present display gray scale with the CCD to obtain actual brightnesses of the respective sub pixels of the OLED display panel at the present gray scale.

12. The method of eliminating OLED display panel Mura according to claim 10, wherein in the step 6, the condition of ending the calculation of the compensation gray scale is: a difference value of the actual brightness and the target brightness of the sub pixel is smaller than a preset allowable deviation brightness.

13. The method of eliminating OLED display panel Mura according to claim 10, wherein in the step 6, the condition of ending the calculation of the compensation gray scale is: the number of the present iterative computation reaches a preset number of a maximum iterative computation.

14. The method of eliminating OLED display panel Mura according to claim 13, wherein the preset number of the maximum iterative computation is three.

15. The method of eliminating OLED display panel Mura according to claim 10, wherein in the step 6, the condition of ending the calculation of the compensation gray scale is: a difference value of the actual brightness and the target brightness of the sub pixel is smaller than a preset error brightness or a number of the present iterative computation reaches a preset number of a maximum iterative computation.

* * * * *